United States Patent
Lee

(10) Patent No.: US 10,312,256 B1
(45) Date of Patent: Jun. 4, 2019

(54) METHOD OF MANUFACTURING THREE-DIMENSIONAL STACKED SEMICONDUCTOR STRUCTURE AND STRUCTURE MANUFACTURED BY THE SAME

(71) Applicant: MACRONIX INTERNATIONAL CO., LTD., Hsinchu (TW)

(72) Inventor: Guan-Ru Lee, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/814,582

(22) Filed: Nov. 16, 2017

(51) Int. Cl.
| | | |
|---|---|---|
| *H01L 21/02* | (2006.01) |
| *H01L 27/11582* | (2017.01) |
| *H01L 29/04* | (2006.01) |
| *H01L 21/28* | (2006.01) |
| *H01L 21/768* | (2006.01) |
| *H01L 21/311* | (2006.01) |
| *H01L 29/16* | (2006.01) |
| *H01L 29/10* | (2006.01) |
| *H01L 23/535* | (2006.01) |
| *H01L 29/51* | (2006.01) |

(52) U.S. Cl.
CPC .. *H01L 27/11582* (2013.01); *H01L 21/02532* (2013.01); *H01L 21/02595* (2013.01); *H01L 21/02636* (2013.01); *H01L 21/28282* (2013.01); *H01L 21/31111* (2013.01); *H01L 21/76895* (2013.01); *H01L 23/535* (2013.01); *H01L 29/04* (2013.01); *H01L 29/1037* (2013.01); *H01L 29/16* (2013.01); *H01L 29/513* (2013.01); *H01L 29/518* (2013.01)

(58) Field of Classification Search
CPC ......... H01L 27/11582; H01L 21/28282; H01L 21/02595; H01L 21/02636
See application file for complete search history.

(56) References Cited

U.S. PATENT DOCUMENTS

| | | |
|---|---|---|
| 8,824,184 B2 | 9/2014 | Baek et al. |
| 8,884,357 B2 | 11/2014 | Wang et al. |
| 9,515,080 B2 | 12/2016 | Takahashi et al. |
| 2013/0270643 A1 | 10/2013 | Lee et al. |

(Continued)

OTHER PUBLICATIONS

TIPO Office Action dated Jul. 26, 2018 in Taiwan application (No. 106139780).

*Primary Examiner* — Douglas M Menz
(74) *Attorney, Agent, or Firm* — McClure, Qualey & Rodack, LLP

(57) ABSTRACT

A three-dimensional (3D) stacked semiconductor structure is provided. A substrate having an array area and a peripheral area is provided, and several patterned multi-layered stacks above the substrate are formed in the array area. The patterned multi-layered stacks are spaced apart from each other, and channel holes are formed between the patterned multi-layered stacks disposed adjacently. A charge trapping layer is formed on the patterned multi-layered stacks and deposited in the channel holes as liners. A polysilicon channel layer is deposited along the charge trapping layer, and conductive pads are formed on the polysilicon channel layer and respectively corresponding to the patterned multi-layered stacks. The polysilicon channel layer has a first thickness (t1), one of the conductive pads has a second thickness (t2), wherein the second thickness (t2) is larger than the first thickness (t1).

7 Claims, 9 Drawing Sheets

(56) References Cited

U.S. PATENT DOCUMENTS

2014/0264353 A1 9/2014 Lai
2015/0249053 A1 9/2015 Or-Bach et al.
2017/0221761 A1 8/2017 Or-Bach et al.

US 10,312,256 B1

METHOD OF MANUFACTURING THREE-DIMENSIONAL STACKED SEMICONDUCTOR STRUCTURE AND STRUCTURE MANUFACTURED BY THE SAME

BACKGROUND

Field of the Invention

The disclosure relates in general to a method of manufacturing a three-dimensional (3D) stacked semiconductor structure and a 3D stacked semiconductor structure manufactured by the same, and more particularly to a method of manufacturing a 3D stacked structure having thick conductive pads.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable NAND-type flash memory structures have been proposed. However, the typical 3D stacked semiconductor structure still suffers from some problems.

For example, for a single gate vertical channel 3D NAND flash, it is necessary to form thin channel for device performance. However contact landing will become a challenge when the channel polysilicon is too thin to land on, which is a problem for the manufacturers.

SUMMARY

The disclosure relates to a method of manufacturing a three-dimensional (3D) stacked semiconductor structure and a structure manufactured by the same. According to the embodiment, the structure provides the conductive pads with increased thickness for contact landing, thereby improving the reliability of electrical performance of the 3D stacked semiconductor structure.

According to one embodiment of the present disclosure, a three-dimensional (3D) stacked semiconductor structure is provided, comprising: a substrate, having an array area and a peripheral area; patterned multi-layered stacks formed in the array area and above the substrate, and the patterned multi-layered stacks spaced apart from each other, and channel holes between the patterned multi-layered stacks disposed adjacently; a charge trapping layer formed on the patterned multi-layered stacks and deposited in the channel holes as liners; a polysilicon channel layer deposited along the charge trapping layer; and conductive pads formed on the polysilicon channel layer and respectively corresponding to the patterned multi-layered stacks, wherein the polysilicon channel layer has a first thickness (t1), one of the conductive pads has a second thickness (t2), and the second thickness (t2) is larger than the first thickness (t1).

According to one embodiment of the present disclosure, is provided, comprising: forming patterned multi-layered stacks above a substrate and within above the substrate of the substrate, wherein the patterned multi-layered stacks are spaced apart from each other, and channel holes between the patterned multi-layered stacks disposed adjacently; forming a charge trapping layer on the patterned multi-layered stacks, and the charge trapping layer deposited in the channel holes as liners; depositing a polysilicon channel layer on the charge trapping layer and formed along the charge trapping layer; and forming conductive pads on the polysilicon channel layer and respectively corresponding to the patterned multi-layered stacks, wherein the polysilicon channel layer has a first thickness (t1), one of the conductive pads has a second thickness (t2), and the second thickness (t2) is larger than the first thickness (t1).

The disclosure will become apparent from the following detailed description of the preferred but non-limiting embodiments. The following description is made with reference to the accompanying drawings.

DETAILED DESCRIPTION

In the embodiments of the present disclosure, a method of manufacturing a three-dimensional (3D) stacked semiconductor structure and a 3D stacked semiconductor structure manufactured by the same are provided. According to a method of the embodiment, the conductive pads above the patterned multi-layered stacks are thickened such as by a selective epitaxial growth process, and the structure having thicker conductive pads can be obtained for solving the problem of contact landing on the thin pads of the conventional structure. Accordingly, an embodied structure provides reliable conductive pads with increased thickness for landing the conductive contacts (ex: BL contacts), thereby improving the reliability of electrical performance of the 3D stacked semiconductor structure. Moreover, the method of the embodiment causes no damage to the related layers and components of the structure, and the method of the embodiment is also suitable for manufacturing the 3D stacked semiconductor structure with large number of the stacking layers without affecting the configuration of structure of the embodiment.

The embodiment of the present disclosure could be implemented in many different 3D stacked semiconductor structures in the applications. For example, the embodiment could be applied to, but not limited to, the 3D vertical-channel (VC) semiconductor devices. The embodiment is provided hereinafter with reference to the accompanying drawings for elaborating the method of manufacturing the 3D stacked semiconductor structure of the disclosure and the structure manufactured by the same. However, the present disclosure is not limited thereto. The descriptions disclosed in the embodiments of the disclosure such as detailed structures, manufacturing procedures and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1A:
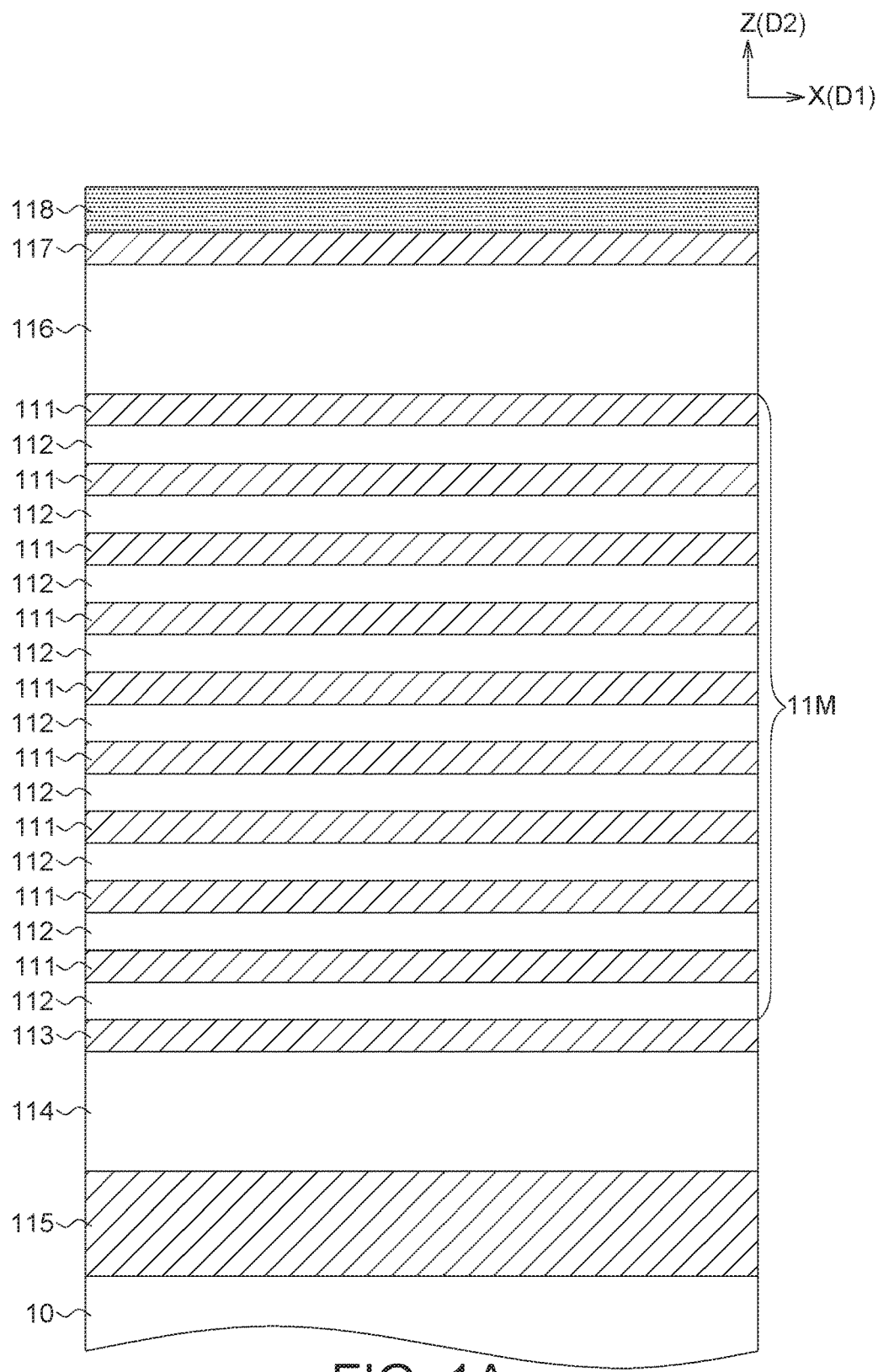
FIG. 1A-FIG. 1H illustrate a method of manufacturing a 3D stacked semiconductor structure according to an embodiment of the present disclosure.

FIG. 1A-FIG. 1H illustrate a method of manufacturing a 3D stacked semiconductor structure according to an embodiment of the present disclosure. As shown in FIG. 1A, a multi-layered stack 11M is formed above a substrate 10, and the multi-layered stack 11M comprises a plurality of insulating layers 111 and a plurality of conductive layers 112 arranged alternately along a second direction D2 (ex: Z-direction) vertical to the substrate 10. In one embodiment, the insulating layers 111 could be oxide layers, and the conductive layers 112 could be polysilicon layers (ex: heavily doped N+ polysilicon layers or heavily doped P+ polysilicon layers).

In one exemplified (but not limited) example, the structure may further comprise a buried oxide layer 115 formed on the substrate 10, a bottom gate layer (ex: an inversion gate) 114 formed on the buried oxide layer 115, and a bottom oxide layer 113 (ex: an inversion oxide) is formed on the bottom gate layer 114, and the multi-layered stack 11M is formed on the bottom oxide layer 113, as shown in FIG. 1A. Also, in one exemplified (but not limited) example, a top polysilicon layer (ex: string select line (SSL) polysilicon layer) 116 is formed on the multi-layered stack 11M, a top oxide layer (ex: SSL oxide) 117 is formed on the top polysilicon layer 116, and a cap layer (ex: SIN as a hard mask (HM)) 118 is formed on the top oxide layer 117.

Figure 1B:
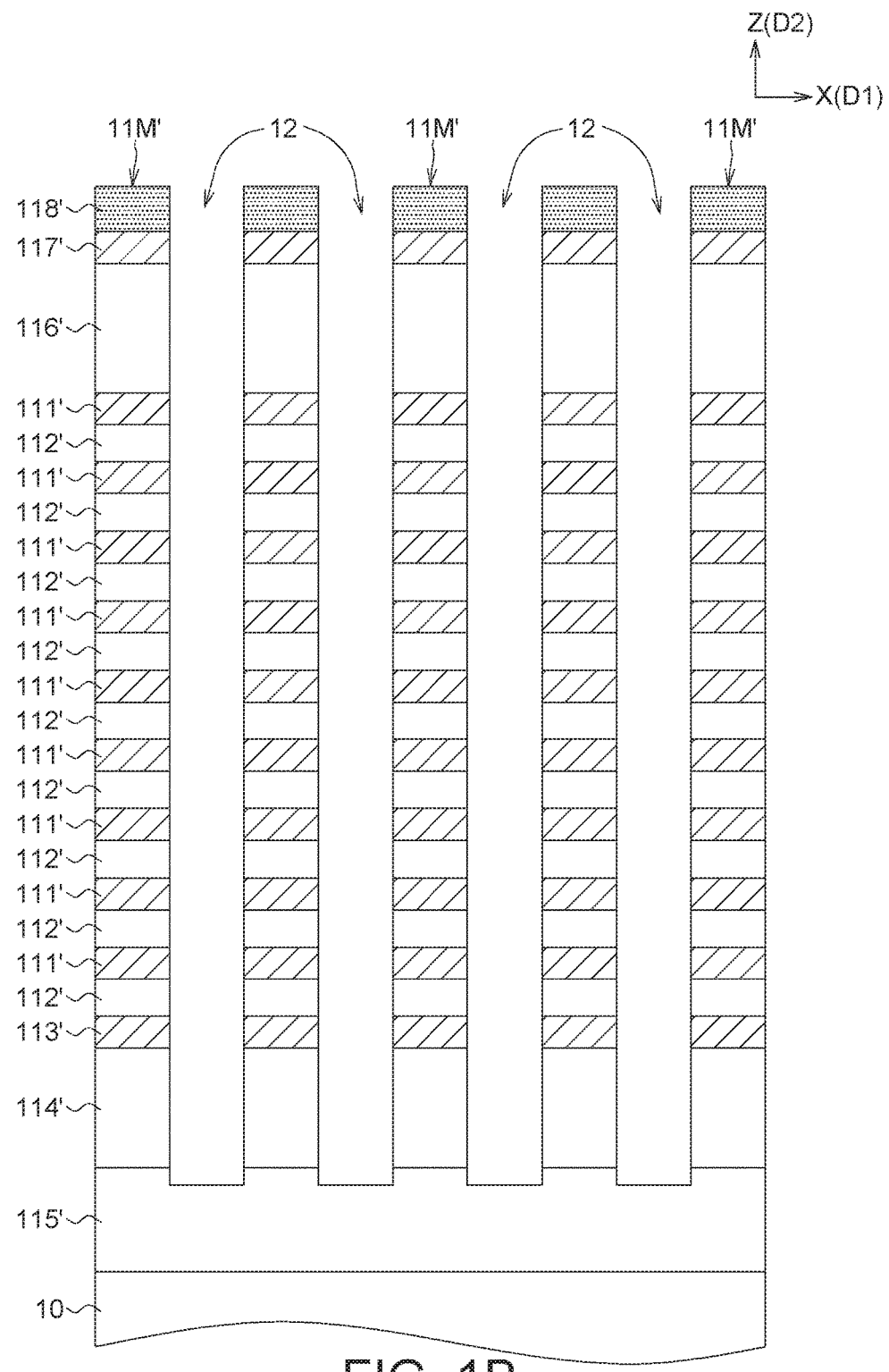

Then, the multi-layered stack 11M is patterned, such as by etching, to form several channel holes 12 and patterned multi-layered stack 11M' vertically to the substrate 10. As shown in FIG. 1B, the patterned multi-layered stack 11M' above the substrate 10 are spaced apart from each other. Also, the channel holes 12 penetrate the cap layer 118, the top oxide layer 117, the top polysilicon layer 116, the multi-layered stack 11M, the bottom oxide layer 113 and the bottom gate layer 114. The channel holes 12 are extended downwardly to stop on the buried oxide layer 115', and expose the sidewalls of the insulating layers 111' and the conductive layers 112'.

Figure 1C:
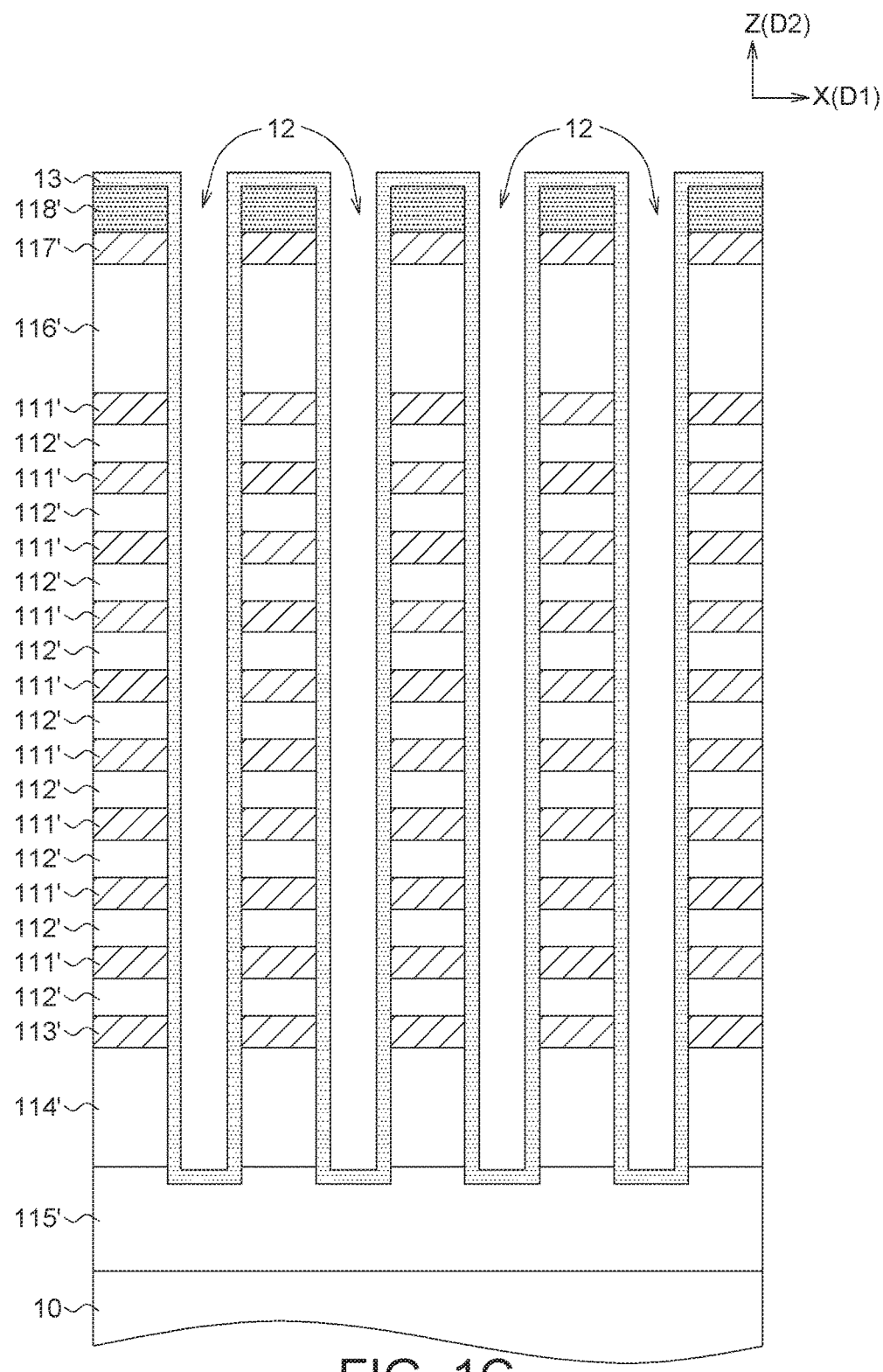

Afterward, a charge trapping layer 13 is formed on the patterned multi-layered stacks 11M', and the charge trapping layer 13 is deposited in the channel holes 12 as liners, as shown in FIG. 1C. In one embodiment, the charge trapping layer 13 functions as a memory layer and could be an ONO layer or an ONONO layer or an ONONONO layer. For example, the charge trapping layer 13 may comprise a blocking oxide layer (adjacent to the sidewalls of the insulating layers 111 and the sidewalls of the conductive layers 112), a trapping nitride layer and a tunneling oxide layer. In the exemplified drawings of the embodiment, one integrated layer is depicted as the charge trapping layer 13 for clear illustration.

Figure 1D:
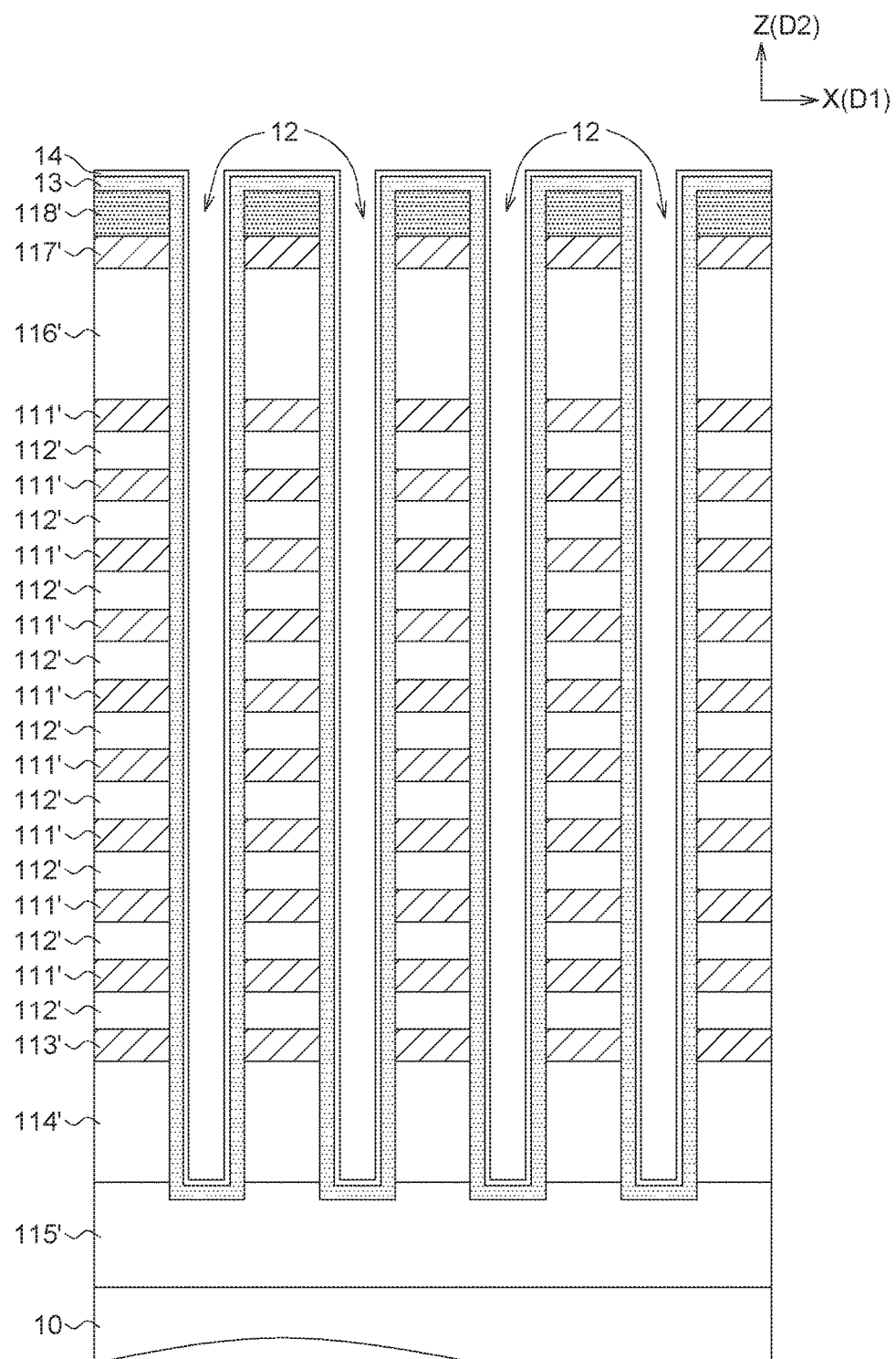

Then, a polysilicon channel layer 14 is deposited on the charge trapping layer 13 and formed along the charge trapping layer 13 (ex: the polysilicon channel layer 14 conformally deposited on the charge trapping layer 13), as shown in FIG. 1D. In one embodiment, the charge trapping layer 13 deposited in the channel holes 12 is formed on the buried oxide layer 115' and directly in contact with the buried oxide layer 115' since the channel holes 12 are extended downwardly to stop on the buried oxide layer 115'. Thus, the polysilicon channel layer 14 and the buried oxide layer 115' are separated by the charge trapping layer 13.

Figure 1E:
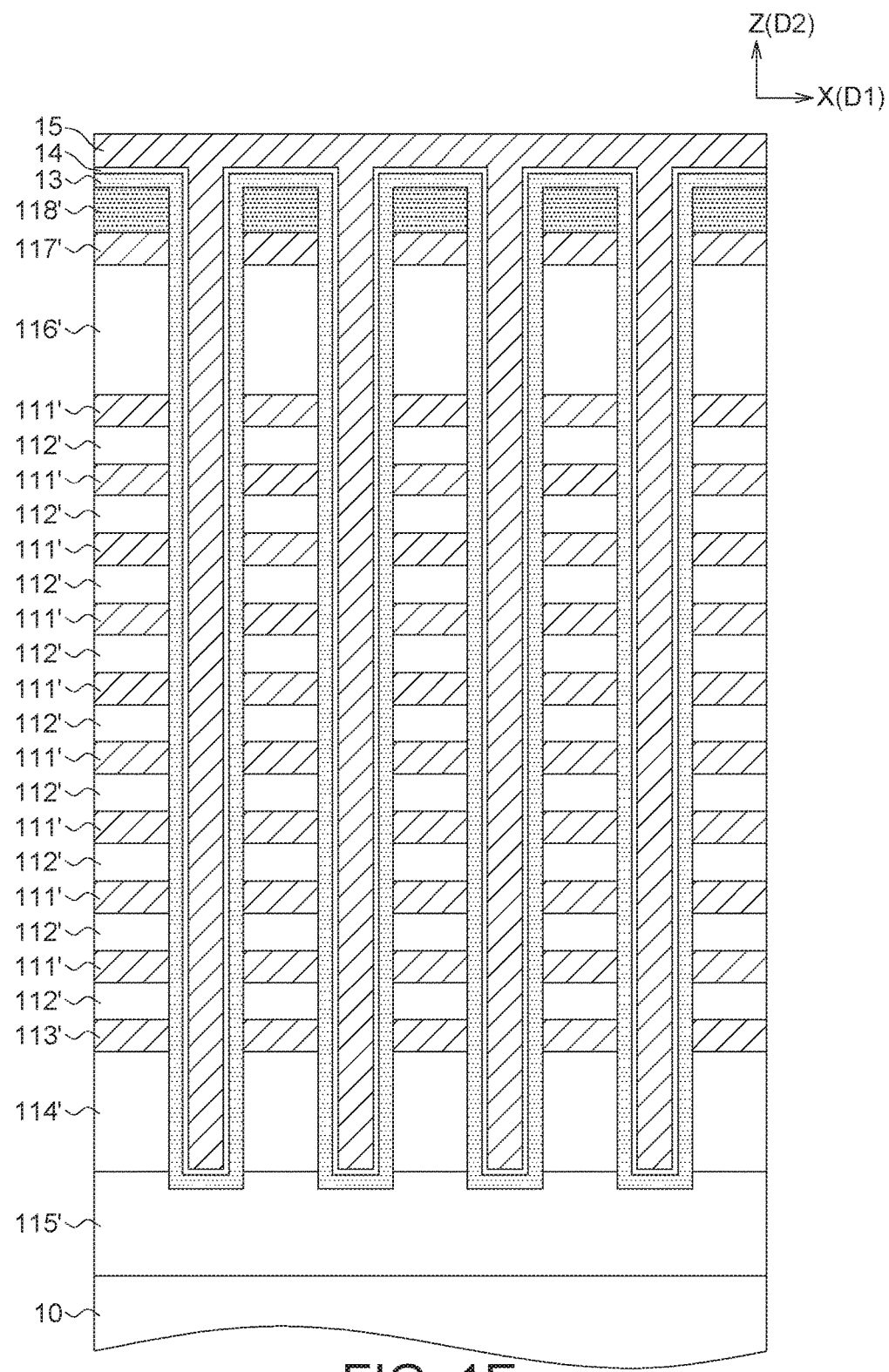

After depositing the polysilicon channel layer 14 on the charge trapping layer 13, the method further comprises depositing a dielectric medium layer (such as oxide) 15 on the patterned multi-layered stacks 11M' for covering the polysilicon channel layer 14 and filling up rest spaces inside the channel holes 12, as shown in FIG. 1E.

Figure 1F:
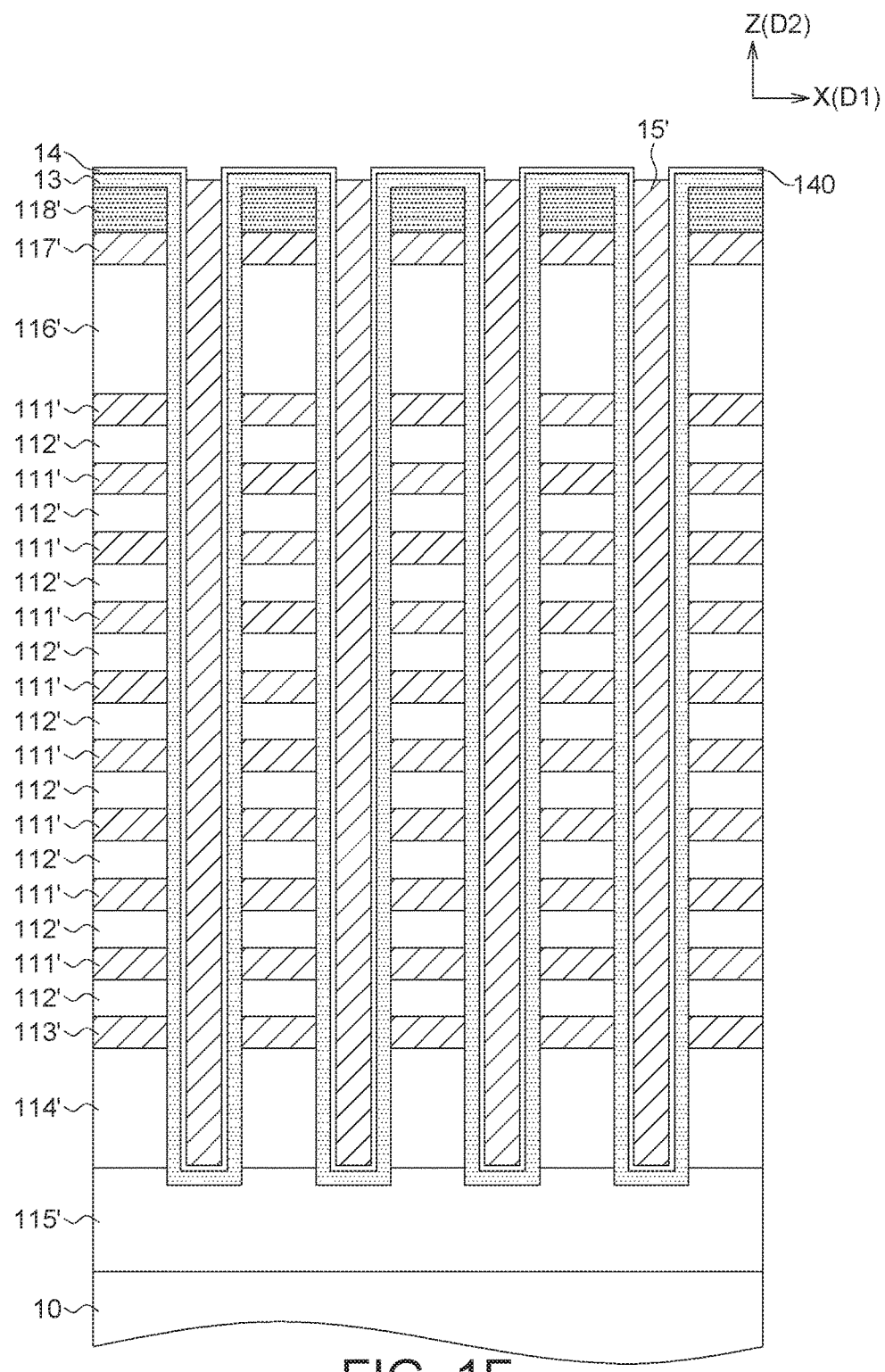

Then, the dielectric medium layer 15 is recessed downwardly to expose at least a top portion 140 of the polysilicon channel layer 14, as shown in FIG. 1F. In one embodiment, the dielectric medium layer 15 is recessed by etching back step.

Figure 1G:
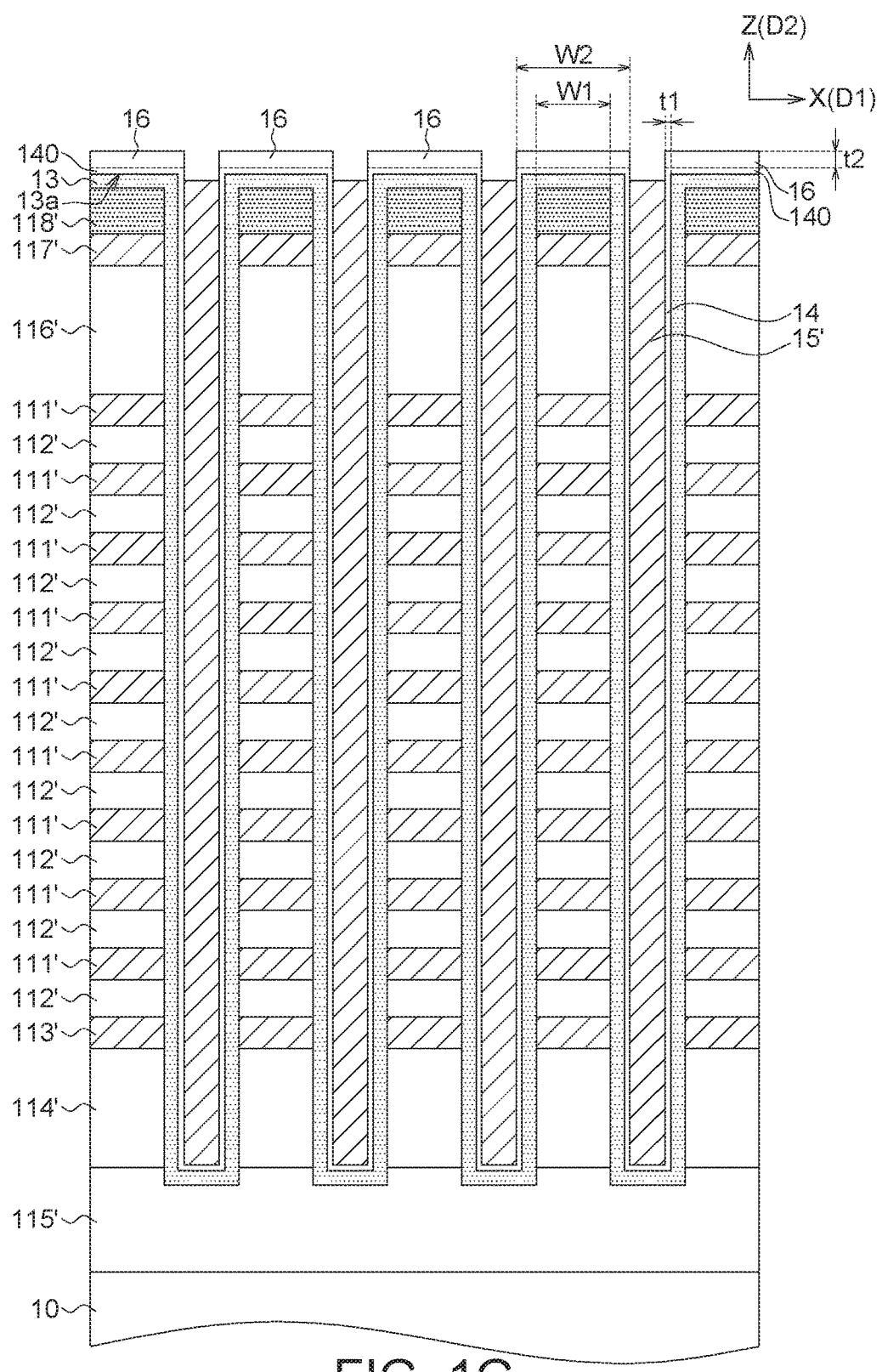

Afterward, several conductive pads 16 are formed on the polysilicon channel layer 14 and respectively corresponding to the patterned multi-layered stacks 11M', as shown in FIG. 1G. In one embodiment, a selective epitaxial growth process is applied to grow the conductive pads 16 on the polysilicon channel layer 14, and the material of the conductive pads 16 and the polysilicon channel layer 14 would be the same. In one example, a selective epitaxial growth process is conducted at a temperature of about 800° C. for about 6 minutes (process time of main step), under a DCS (diclolo-silane, $SiH_2Cl_2$)—HCl—$H_2$ system (gas ratio=DCS/HCl/H2=200 sccm/180 sccm/25 slm), wherein the silicon loss is about 200 A. According to the embodied structure, the polysilicon channel layer 14 has a first thickness t1, and one of the conductive pads 16 has a second thickness t2, wherein the second thickness t2 is larger than the first thickness t1.

According to an embodiment, the polysilicon channel layer 14 also covers a top surface 13a of the charge trapping layer 13, and the top portion 140 of the polysilicon channel layer 14 is formed on the top surface 13a of the charge trapping layer 13. When a selective epitaxial growth process is applied, the epi-polysilicon film only grows on the top portion 140 of the polysilicon channel layer 14 rather than on other material such as oxide (i.e. not grows on the dielectric medium layer 15).

Figure 1H:
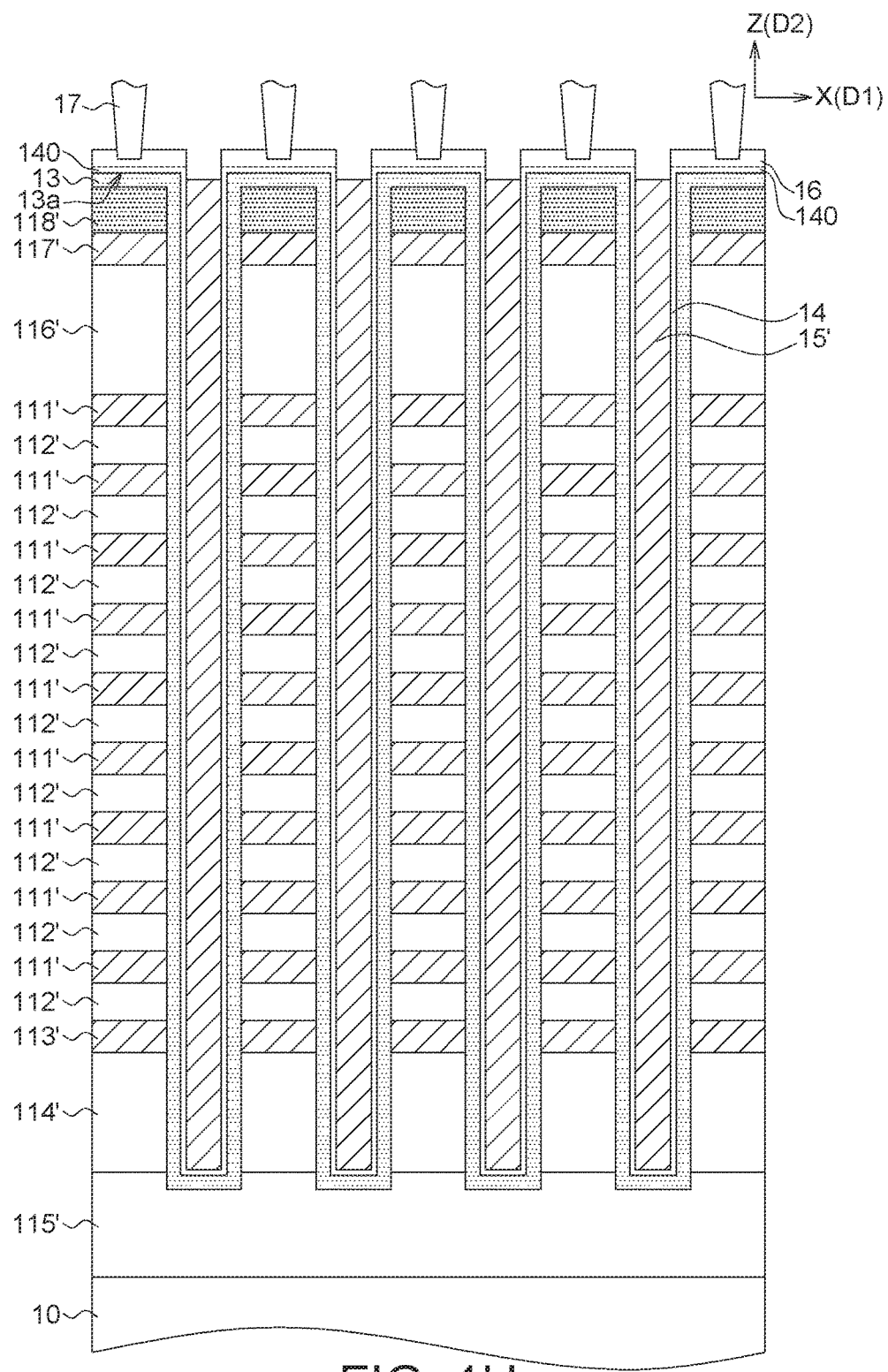

After forming the conductive pads 16, several conductive contacts 17 (such as Bit line contacts) are respectively formed on the conductive pads 16, wherein the conductive contacts 17 are electrically connected to the conductive pads 16 correspondingly, as shown in FIG. 1H. In one embodiment of a VC type 3D semiconductor structure of the application, the conductive layers 112 function as word lines (WLs), and the conductive pads 16 are bit line (BL) pads, and the conductive contacts 17 are BL contacts.

Figure 2:
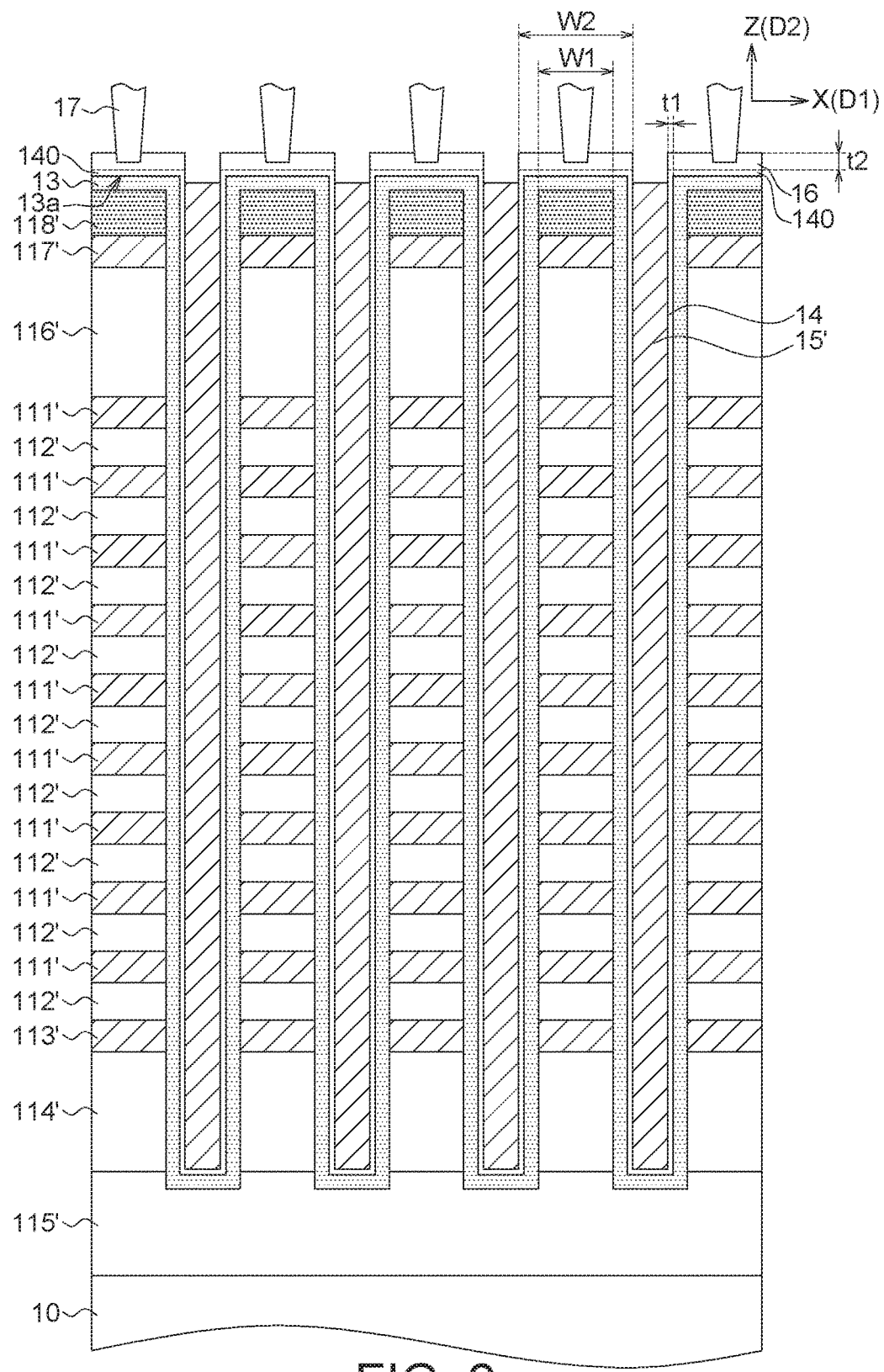
FIG. 2 depicts a 3D stacked semiconductor structure according to an embodiment of the present disclosure.

FIG. 2 depicts a 3D stacked semiconductor structure according to an embodiment of the present disclosure. As shown in FIG. 2, the polysilicon channel layer 14 has a first thickness t1, one of the conductive pads 16 has a second thickness t2, wherein the second thickness t2 is larger than the first thickness t1. It is noted that a length of the polysilicon channel layer 14 parallel to a first direction D1 (ex: along X-direction) of FIG. 2 is determined as the first thickness t1, and a length of the conductive pads 16 parallel to a second direction D2 (ex: along Z-direction) is determined as the second thickness t2 herein, wherein the second direction D2 is perpendicular to the first direction D1. Moreover, according an embodied configuration as shown in FIG. 2, the conductive layers 112 of one of the patterned multi-layered stacks 11M' has a first width W1 along the first direction D1, one of the conductive pads 16 has a second width W2 along the first direction D1, wherein the second width W2 is larger than the first width W1.

Also, in one embodiment, a ratio of the second thickness t2 to the first thickness t1 is in a range of 2 to 10, such as in a range of 2 to 5. In one embodiment, the first thickness t1 is in a range of 50 Å to 150 Å. In one embodiment, the second thickness t2 is in a range of 200 Å to 600 Å. In one (but not limited) example, the second thickness t2 is about 400 Å when the adjacent conductive pads 16 are spaced apart from about 100 nm. It is noted that those numerical values described herein are provided for illustration, not for limitation.

Noted that the configuration of the application could be slightly different, depending on the actual layers required in the practical application. For example, in one (but not limited) example, the charge trapping layer is formed on the cap layer 118; thus, for the configuration of one stack, the cap layer 118, the top oxide layer 117, the top polysilicon layer 116, the patterned multi-layered stack 11M', the bottom oxide layer 113, the bottom gate layer 114 and the buried oxide layer 115 are contained in the charge trapping layer 13, as shown in FIG. 2. However, those stacked layers would be modified or changed depending on the types of the semiconductor structures of the application.

According to the method and structures of the 3D stacked semiconductor structure as illustrated in the embodiment above, the conductive pads above the patterned multi-layered stacks are thickened such as by a selective epitaxial growth process, and the embodied structure provides reliable conductive pads with increased thickness for landing the conductive contacts (ex: BL contacts). In one embodiment, since the selective epitaxy only grows films on the polysilicon material rather than oxide material, the neighboring conductive pads can keep in excellent isolation. Hence the contact etching can stop on the thicker conductive pads (ex: BL pads) without increasing the thickness of the polysilicon channel layer. Therefore, the reliability of electrical performance of the 3D stacked semiconductor structure can be improved. Moreover, the method of the embodiment causes no damage to the related layers and components of the structure, and the method of the embodiment is also suitable for manufacturing the 3D stacked semiconductor structure with large number of the stacking layers without affecting the configuration of structure of the embodiment (i.e. structure possesses a solid construction, a complete profile of the related layers and components). Furthermore, the 3D stacked semiconductor structure of the embodiment is manufactured by adopting no time-consuming and expensive procedures, which is suitable for mass production.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in the array area of a 3D stacked semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) stacked semiconductor structure, comprising:
   a substrate, having an array area and a peripheral area;
   patterned multi-layered stacks formed in the array area and above the substrate, and the patterned multi-layered stacks spaced apart from each other, and channel holes formed between the patterned multi-layered stacks disposed adjacently;
   a charge trapping layer formed on the patterned multi-layered stacks and deposited in the channel holes as liners;
   a polysilicon channel layer deposited along the charge trapping layer; and
   conductive pads formed on the polysilicon channel layer and respectively formed above corresponding one of the patterned multi-layered stacks,
   wherein one of the patterned multi-layered stacks comprises a plurality of insulating layers and a plurality of conductive layers arranged alternately,
   wherein the plurality of conductive layers of one of the patterned multi-layered stacks has a first width (W1), one of the conductive pads has a second width (W2), and the second width (W2) is larger than the first width (W1),
   wherein the polysilicon channel layer has a first thickness (t1), one of the conductive pads has a second thickness (t2), and the second thickness (t2) is larger than the first thickness (t1).

2. The 3D stacked semiconductor structure according to claim 1, wherein a buried oxide layer is formed on the substrate, a bottom gate layer is formed on the buried oxide layer, and a bottom oxide layer is formed on the bottom gate layer, and one of the patterned multi-layered stacks is formed on the bottom oxide layer.

3. The 3D stacked semiconductor structure according to claim 2, wherein the channel holes are vertical to the substrate and extended downwardly to stop on the buried oxide layer, wherein the charge trapping layer deposited in the channel holes is also formed on the buried oxide layer.

4. The 3D stacked semiconductor structure according to claim 2, wherein the polysilicon channel layer and the buried oxide layer are separated by the charge trapping layer.

5. The 3D stacked semiconductor structure according to claim 1, wherein a dielectric medium layer fills up rest spaces inside the channel holes, and conductive contacts are formed on and electrically connected to the conductive pads respectively.

6. The 3D stacked semiconductor structure according to claim 1, wherein a ratio of the second thickness (t2) to the first thickness (t1) is in a range of 2 to 10.

7. The 3D stacked semiconductor structure according to claim 1, wherein the second thickness (t2) is in a range of 200 Å to 600 Å.

* * * * *